United States Patent [19]

Asano et al.

[11] Patent Number: 4,864,356
[45] Date of Patent: Sep. 5, 1989

[54] EXPOSURE DEVICE FOR IMAGE RECORDING APPARATUS

[75] Inventors: Yuji Asano; Masashi Ueda; Shunichi Higashiyama, all of Nagoya; Kiyoharu Hayakawa, Aichi; Yumio Matsumoto, Kasugai; Akira Sago, Nagoya; Osamu Takagi, Nagoya; Toshio Sakai, Nagoya; Yukichi Sawaki, Gifu, all of Japan

[73] Assignee: Brother Kogyo Kabushiki Kaisha, Aichi, Japan

[21] Appl. No.: 183,050

[22] Filed: Apr. 19, 1988

[30] Foreign Application Priority Data

Apr. 21, 1987 [JP] Japan .................. 62-99054
Apr. 30, 1987 [JP] Japan .................. 62-107027
Jun. 12, 1987 [JP] Japan .................. 62-91192[U]
Jul. 29, 1987 [JP] Japan .................. 62-189800

[51] Int. Cl.⁴ ............................. G03B 27/52
[52] U.S. Cl. .......................... 355/30; 430/30
[58] Field of Search .............. 355/27, 30, 106; 354/202 FF; 430/30, 138

[56] References Cited

U.S. PATENT DOCUMENTS 4,399,209 8/1983 Sanders et al. .............. 430/138
4,624,554 11/1986 Ohtsuka et al. ............. 355/64
4,720,732 1/1988 Tsutsui ...................... 355/30

FOREIGN PATENT DOCUMENTS 1056223 1/1967 United Kingdom .
1534450 12/1978 United Kingdom .
2013909 8/1979 United Kingdom .
2100453 12/1982 United Kingdom .
2166879 5/1986 United Kingdom .
2190759 11/1987 United Kingdom .

Primary Examiner—L. T. Hix
Assistant Examiner—Brian W. Brown
Attorney, Agent, or Firm—Oliff & Berridge

[57] ABSTRACT

In an exposure device in an image recording apparatus, a photosensitive recording medium is exposed with light containing an image of an original to thereby form a latent image corresponding to the original. In view of the fact that photosensitivity of the recording medium changes depending upon some factors, such as a temperature of the recording medium per se, an intensity of light irradiated onto the recording medium, the temperature of the recording medium is controlled so that an optimum photosensitivity is obtained. The change of the light intensity is compensated for by changing the temperature of the recording medium. To this effect, the temperature of the recording medium and the light intensity of a light source are sensed and the recording medium is heated by a heater element so as to indicate an optimum photosensitivity.

16 Claims, 5 Drawing Sheets

EXPOSURE DEVICE FOR IMAGE RECORDING APPARATUS

BACKGROUND OF THE INVENTION

The present invention relates to an image recording apparatus. More particularly, the invention relates to an exposure device for such an image recording apparatus.

Conventional exposure device for image recording apparatus generally includes an exposure unit, a light transmitting unit, and an image forming unit. In the exposure unit, a light is irradiated onto an original. In the light transmitting unit, the light reflected on or transmitted through the original is directed to a photosensitive recording medium through an optical system composed of reflector, filter, lens and the like. In the image forming unit, a latent image is formed on the photosensitive recording medium in accordance with the light transmitted by the light transmitting unit.

The sensitivity of such a photosensitive recording medium changes depending on the temperature of the recording medium per se. Provided that the intensity of light radiation for the photosensitive recording medium is constant, the sensitivity of the recording medium is lowered when the temperature of the recording medium is excessively high or low. The photosensitive recording medium shows a good sensitivity in a certain temperature range. Since the photosensitive recording medium is easily affected by ambient temperature such as a room temperature and the thermic rays irradiated from a light source, reproducibility of the image formed on the photosensitive recording medium is degraded and irregularity of the image formed thereon occurs.

The fluctuation of the intensity of the light radiation also causes to degrade reproducibility and to occur irregularity of the image formed on the recording medium. The amount of light radiated from a halogen lamp used as a light source is changes greatly when the voltage applied thereto slightly fluctuates. This is due to the fact that the intensity of the radiation light from the halogen lamp varies in proportion to third to fifth power of the voltage applied to the halogen lamp. Accordingly, the reproducibility of the image formed on the photosensitive recording medium is degraded even though the voltage applied to the light source is slightly fluctuated.

A prior art exposure device further causes poor reproducibility and irregularity of the image formed on the recording medium when photosensitive and pressure-sensitive recording sheet as disclosed in U.S. Pat. No. 4,399,209 is used. In such a device, the photosensitive recording medium intimately overlapped on the original are set on a plane support and a transparent plate is urged thereon with pressure, so that the photosensitive recording medium contacts the original. Light is radiated onto the photosensitive recording medium through a transparent plate and the original. If the surfaces of the plane support and the transparent plate are uneven, the pressure applied to the recording medium may locally become high. As a result, the microcapsule may be ruptured by this concentrated pressure, thus a fogging may occur in the reproduced copy.

SUMMARY OF THE INVENTION

It is therefore an object of the present invention to overcome the above-described disadvantages, and to provide an improved exposure device for an image recording apparatus which can form a recording image with excellent reproducibility, sharpness, gradation, and uniformity.

Another object of this invention is to provide the exposure device which includes a control system for keeping the temperature of a photosensitive recording medium within a predetermined range to thereby form an excellent image.

Still another object of this invention is to provide a control system which controls the photosensitive recording medium to be free from the fluctuation of a light intensity.

Yet another object of this invention is to provide an exposure device which can be applied to various photosensitive image recording apparatuses.

Still another object of this invention is to provide an exposure device which can form a recording image without fogging.

These and other objects of the present invention can be attained by providing an exposure device for an image recording apparatus which comprises a light emitting unit, a light transmitting unit, an original supporting unit, a light receiving unit in which a photosensitive recording medium is set, and a temperature control unit for controlling the temperature of the photosensitive recording medium.

According to another aspect of the present invention, the above described temperature control unit includes a first sensor for sensing the temperature of the light receiving unit, an adjusting means for adjusting the temperature of the light receiving unit, a second sensor for sensing the intensity of the light radiated from the light emitting unit, and a compensating unit for compensating the adjusting means on the basis of the sensed data from the second sensor.

Other objects and aspects of the invention will become apparent from the following description of embodiments.

DETAILED DESCRIPTION OF THE PREFERRED EMBODIMENTS

A first embodiment according to this invention will be described with reference to FIGS. 1 through 3.

Figure 1:
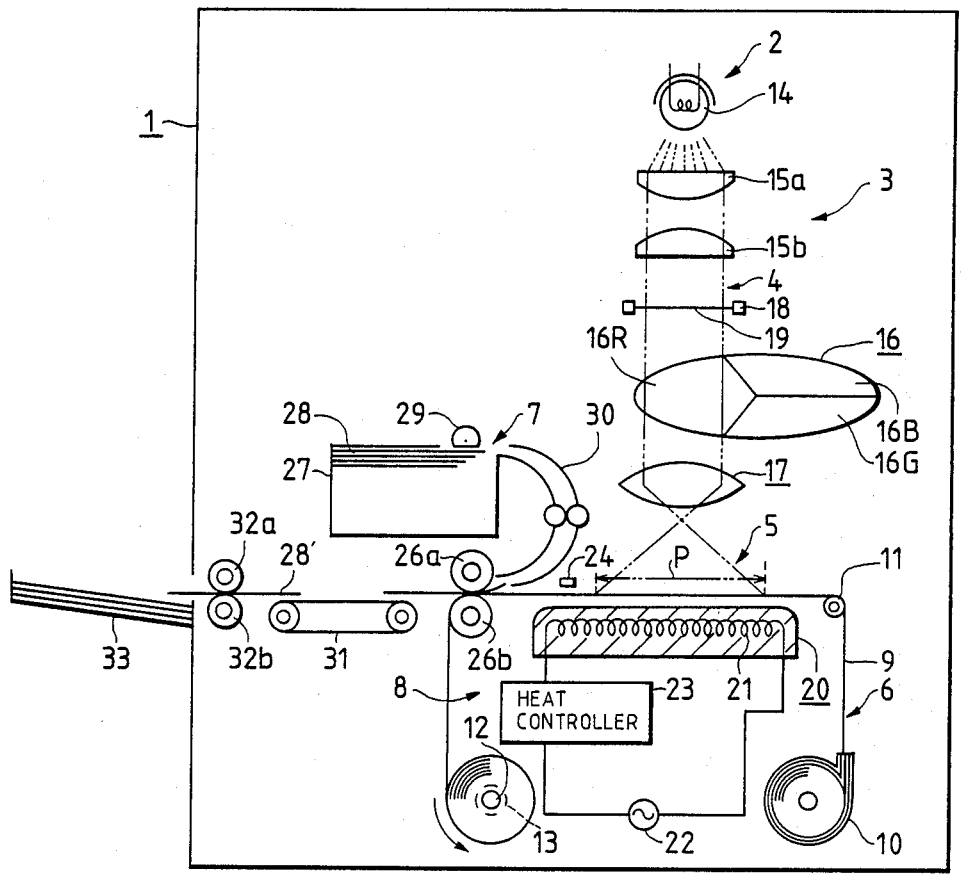
FIG. 1 is a schematic view showing an overall arrangement of an exposure device for a color image recording apparatus according to a first embodiment of this invention.
Figure 2:
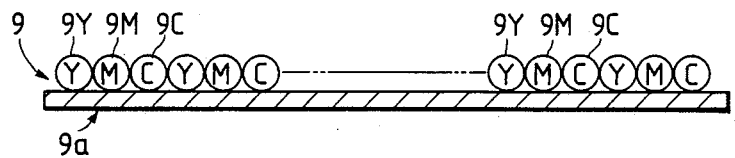
FIG. 2 is a partial cross-sectional view showing a photosensitive and pressure-sensitive recording medium used in the exposure device shown in FIG. 1.

FIG. 1 shows an overall arrangement of an exposure device which is adapted for a color image recording apparatus. The overall view of the color image recording apparatus per se is not shown in this drawing. The exposure device includes a main body 1 in which included are a light emitting unit 2, a light transmitting unit 3, an original image supporting unit 4, a light receiving unit 5, a photosensitive recording medium supporting unit 6, a developing unit 7, and a temperature control unit 8.

This embodiment employs a photosensitive and pressure-sensidstive recording paper 9 as a recording medium. The recording paper 9 is rolled within a recording paper accommodating case 10 which is arranged near the bottom of the main body 1. The recording paper 9 is extended from the case 10 and supportingly led by a guide roller 11. The recording paper 9 is further extended through the light receiving unit 5 and the developing unit 7, and is wound around a winding roller 12 which is driven by a motor 13.

The recording paper 9 as used herein is of the type capable of color recording. As shown in FIG. 2, a substrate 9a is coated with a microcapsule layer in which cyan microcapsules 9C, magenta microcapsules 9M, and yellow microcapsules 9Y are uniformly dispersed. The cyan microcapsule 9C includes cyan dye precursor (or cyan chromogenic material) as a main component, photocuring resin, photosensitizer, photo polymerization initiator, and so on. Also the main component of the magenta microcapsule 9M is a magenta dye precursor, and that of the yellow microcapsule 9Y is a yellow dye precursor.

The light emitting unit 2 is arranged near the top of the main body 1. This unit 2 includes a light source 14 and an electric control device (not shown). This embodiment employs a halogen lamp as the light source 14 from which white light is emitted.

In the path of light emitted from the light source 14, the light transmitting unit 3 and the original supporting unit 4 are arranged. The light transmitting unit 3 includes a pair of collimator lenses 15a, 15b, a trichromatic resolution filter 16, and a focusing lens 17. The original supporting unit 4 includes a supporting member 18 and an original 19. In this embodiment, a color transparency or color positive slide is used as the original 19.

The trichromatic resolution filter 16 includes a red filter 16R for the cyan microcapsule 9C, a green filter 16G for the magenta microcapsule 9M, and a blue filter 16B for the yellow microcapsule 9Y. Each of the filters permits transmitting only a specific light corresponding to the spectral sensitivity of the dye precursor contained in the respective microcapsules. In this embodiment, the red filter 16R transmits only the light having a wavelength of 650 nm which photocures the cyan microcapsule 9C, the green filter 16G transmits only the light having a wavelength of 550 nm which photocures the magenta microcapsule 9M, and the blue filter 16B transmits only the light having a wavelength of 450 nm which photocures the yellow microcapsules 9Y.

One of the three filters 16R, 16B and 16G is selectively disposed in the light path, and the light transmitted through the original 19 is filtered by the selected filter. The light thus filtered is irradiated onto a light receiving area P of the light receiving unit 5.

The light receiving unit 5 includes a recording paper support 20 for supporting the recording paper 9. The recording paper support 20 is provided with a heating member 21 which is electrically connected to an AC power source 22 through a heat controller 23. The heat controller 23 is further connected to a temperature sensor 24 arranged above the recording paper support 20 to sense the surface temperature of the recording paper 9. The heat controller 23 is also connected to a temperature setting means 25 (not shown in FIG. 1) which is assembled on a control panel of the main body 1.

Figure 3:
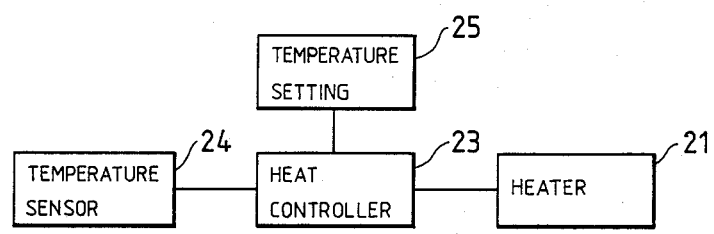
FIG. 3 is a block diagram showing a temperature control means assembled within the first embodiment.

As shown in FIG. 3, the heat controller 23 compares a preset data input from the temperature setting means 25 with the sensed data input from the temperature sensor 24, and controls the heating member 21 in response to the comparison results. In this embodiment, the temperature control unit 8 is composed of the heating unit 21, the AC power source 22, the heat controller 23, the temperature sensor 24, and the temperature setting means 25.

The developing unit 7 is provided in downstream of the light receiving unit 5. The recording paper 9 exposed at the light receiving unit 5 is inserted into a nip between a pair of pressure rollers 26a and 26b. Above the rollers 26a and 26b, a paper cassette 27 is arranged. The cassette 27 contains developer sheets 28 which are coated with a developer material which reacts with the dye precursors contained in the microcapsules 9C, 9M, and 9Y. The uppermost developer sheet 28 is supplied to the pressure rollers 26a and 26b by the feeding motion of a feeding roller 29 and a sheet leading means 30. The developer sheet 28 is overlaid on the recording paper 9, and they are simultaneously subjected to the pressure development by the pressure rollers 26a and 26b. The microcapsules which remain uncured are ruptured, and the dye precursors flown away from the ruptured capsules react with the developer material on the developer sheet 28. Then, a visible image appears on the developer sheet 28 as a color image through the pressure development. The developed sheet 28' is conveyed by a sheet conveyer 31 and passed through a pair of image fixing rollers 32a and 32b to fix the developed image. The fixed sheet 28' is received by a sheet tray 33 outside the main body 1.

An operation of this exposure device will next be described.

As shown in FIG. 1, the photosensitive and pressure-sensitive recording paper 9 is led from the recording paper accommodating case 10 and set at the light receiving area P on the recording paper support 20. On this support 20, the recording paper 9 is heated by the heating member 21. The heat controller 23 is supplied with the preset data from the temperature setting means 25 which preset data is determined so that the recording paper 9 shows an optimum sensitivity; in this embodiment, 40°±5° C. The temperature sensor 24 senses the actual temperature at the surface of the recording paper 9 heated by the heating member 21, and outputs the sensed data to the heat controller 23. The controller 23 controls the heating member 21 to be equal to the preset value. According to this temperature control, the surface temperature of the recording paper 9 is maintained at a constant value regardless of the ambient temperature.

Under this condition, the recording paper 9 is exposed as follows. When the color transparency is used for the original, the same color lights are irradiated to the recording paper 9 through the trichromatic resolution filter 16. This exposure device proceeds the exposure in the order of a red light, a green light, and a blue light. The trichromatic resolution filter 16 is firstly shifted to set the red filter 16R in the light pass and then the light source 14 is turned on. Next, the green filter 16G is set in the light pass. Finally, the blue filter 16B is set in the light pass to transmit the blue light.

First, the red filter 16R transmits the light having the wavelength of 650 nm which cures only the cyan microcapsules 9C. Thus, a first latent image corresponding to the red ligth pattern of the original 19 is formed on the recording paper 9.

Second, the green filter 16G transmits the light which cures only the magenta microcapsules 9M. Thus, a second latent image corresponding to the green light pattern of the original 19 is also formed.

Third, the blue filter 16B transmits the light which cures only the yellow microcapsules 9Y. Thus, a third latent image corresponding to the blue light pattern of the original 19 is also formed.

After multiplexedly forming the latent image, the recording paper 9 is overlaid with the developer sheet 28 fed from the sheet cassette 27 and they are subjected to the pressure development by the pressure rollers 26a and 26b. The microcapsules which remain uncured are ruptured and the dye precursors contained therein are flown out and the dye precursors react with the developer materials coated on the developer sheet 28, whereby a visible color image is formed on the developer sheet 28. The thus developed sheet 28' is further subjected to the image fixing operation through the image fixing rollers 32a and 32b and finally discharged out of the main body 1. The tray 33 receives the developed sheets 28'.

The developing process will be described in detail.

In the first latent image area where only the cyan microcapsules 9C are cured, the magenta microcapsules 9M and the yellow microcapsules 9Y are ruptured and the magenta and yellow dye precursors are reacted with the developer materials. This reaction forms a red color area.

In the second latent image area where only the magenta microcapsules 9M are cured, the yellow microcapsules 9Y and the cyan microcapsules 9C are ruptured and the yellow and cyan dye precursors are reacted with the developer materials. This reaction forms a green color area.

In the third latent image area where only the yellow microcapsules 9Y are cured, the magenta microcapsules 9M and the cyan microcapsules 9C are ruptured and the magenta and cyan dye precursors are reacted with the developer materials. This reaction forms a blue color area.

When the original 19 has black color patterns such as characters, shadow, and the like, such black patterns do not allow the light to transmit. Since none of the microcapsules are cured, the cyan, magenta and yellow microcapsules are ruptured at the same occasion. Three dye precursors of the three kinds of the microcapsules react with the developer material and thus a black color image is formed on the developer sheet 28 corresponding to the black patterns of the original 19.

As given explanation above, the first embodiment of the exposure device can maintain the surface temperature of the recording paper 9 at the optimum temperature range owing to the temperature control unit 8 arranged below the light receiving area P. The photochemical reaction progresses under the optimum temperature condition regardless of the ambient temperature and provides an improved image excellent in uniformity and reproducibility.

When the light intensity is not varied, the gradation of the image reproduced on the recording paper 9 can be changed as the temperature of the recording paper 9 is gradually varied. If the temperature setting means 25 of this embodiment is consciously controlled to change the temperature of the recording paper 9, a required gradation may be realized.

Figure 4:
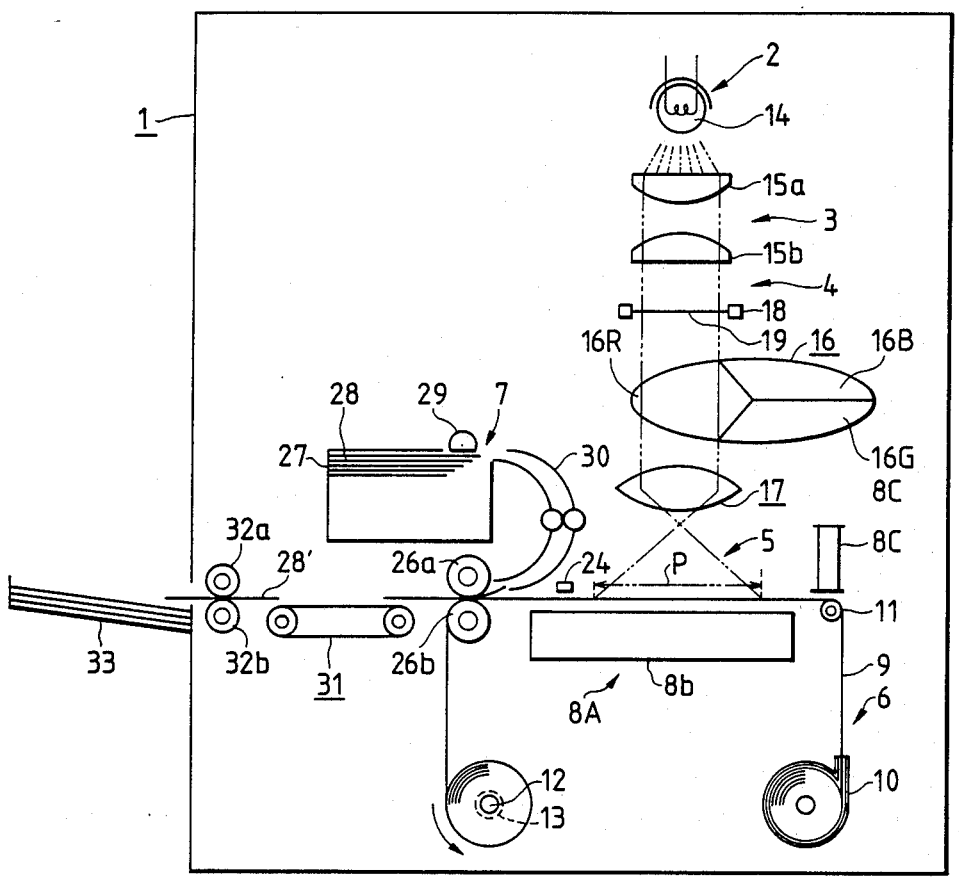
FIG. 4 is a schematic view showing an overall arrangement of an exposure device for a color image recording apparatus according to a second embodiment of this invention.

A second embodiment of this invention will be described with reference to FIG. 4, wherein like parts and components are designated by like reference numerals and charactors as those shown in FIG. 1.

In this second embodiment, particular improvements are made on a temperature control unit 8A. This control unit 8A includes a temperature sensor 24 for sensing the surface temperature of the recording paper 9, a temperature setting means 25, a temperature controller 23, a cooling member 8b and a fan 8c. These components have the similar functions to those of the first embodiment except for the cooling member 8b and the fan 8c. This embodiment employs a heat exchanger using a chlorofluoro carbon gas as a coolant for the cooling member 8b. The cooling intensity of the cooling member 8b and the rotational speed of the fan 8c are controlled by the heat controller 23 in the same manner as in the first embodiment.

Figure 5:
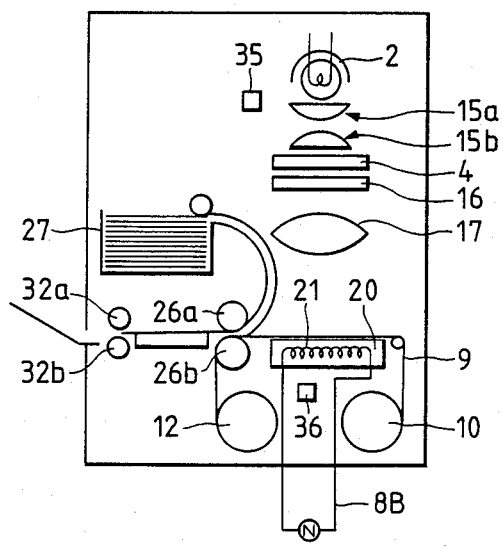
FIG. 5 is a schematic view showing an overall arrangement of an exposure device for an image recording apparatus according to a third embodiment of this invention.
Figure 6:
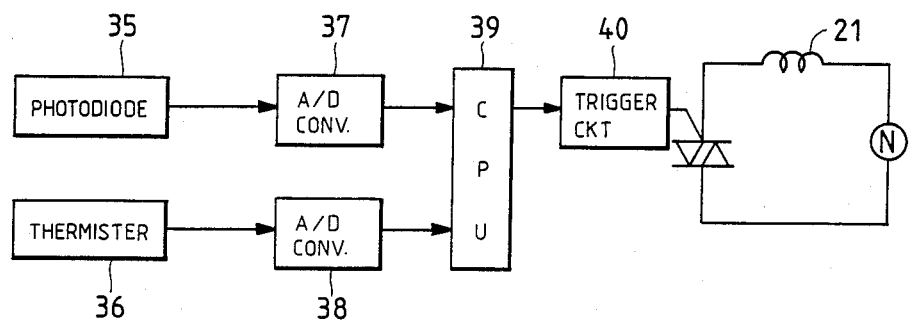
FIG. 6 is a block diagram showing a temperature control means assembled within the third embodiment.

A third embodiment of this invention will be described with reference to FIGS. 5 through 6, wherein like parts and components are designated by like reference numerals and charactors as those shown in FIG. 1.

The constitution of the third embodiment of this invention is substantially same as the first embodiment except for a temperature control unit 8B which is adapted for sensing the change of light intensity. The temperature control unit 8B includes a photodiode 35 arranged near the light source 2 for sensing the light intensity thereof, a thermistor 36 arranged near the recording paper support 20 for sensing the temperature of the recording paper 9 set at the light receiving area, a first A/D convertor 37 electrically connected to the photodiode 35, a second A/D convertor 38 electrically connected to the thermistor 36, a central processing unit (CPU) 39 electrically connected to the first and second A/D convertors 37 and 38, a trigger circuit 40 electrically connected to the CPU 39, and the heating member 21 electrically connected to the trigger circuit 40 and arranged in the recording paper support 20.

An operation of the third embodiment of this invention will be described.

In view of the fact that the light intensity applied to the recording paper 9 fluctuates in accordance with the change of the voltage applied to the light source 2, this embodiment provides a system for absorbing the fluctuation of the light intensity by changing the photosensitivity of the recording paper 9. The photosensitivity of the recording paper 9 depends also on its temperature in such a fashion that it becomes poor as the temperature rises.

When the light intensity of the light source 2 is lowered during exposure, the photodiode 35 senses the change of the light intensity and outputs a voltage corresponding to the lowered degree of the light intensity to the first A/D convertor 37. The convertor 37 converts the input analog signal into a first digital signal, and outputs the converted digital signal to the CPU 39. The temperature of the recording paper support 20 is maintained at a predetermined value by the heating member 21. The thermistor 36 detects the actual temperature of the recording paper support 20 and inputs the detected analog signal to the second A/D convertor 38. The A/D convertor 38 converts the input analog signal into a second digital signal. The CPU 39 compares the first digital signal from the first A/D convertor 37 with the second digital signal from the second A/D convertor 38, and outputs a command signal to the trigger circuit 40. The CPU 39 computes the required temperature level for compensating the lowering of the light intensity. That is, the CPU 39 outputs the command signal for lowering the temperature of the recording paper support 20. As a result, the heating temperature of the heating member 21 is lowered.

When the voltage applied to the light source 2 is increased, the CPU 39 outputs a signal for increasing the heating temperature of the heating member 21.

This third embodiment provides a system for compensating the fluctuation of the light intensity in addition to the temperature control for the recording medium.

The photodiode 35 may be replaced by means for detecting the input voltage applied to the device or the voltage applied to the light source 2.

A fourth embodiment of the present invention will be described with reference to FIG. 7. This embodiment relates to an exposure device which is adapted for an original contacting type exposure system employing the photosensitive recording sheet and a developer sheet as proposed in U.S. Pat. No. 4,399,209.

Figure 7:
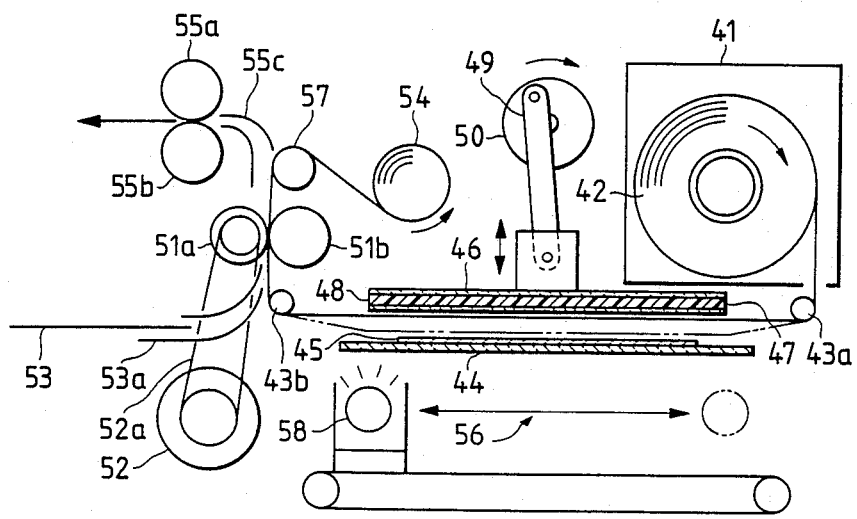
FIG. 7 is a schematic view showing an overall arrangement of an exposure device for an image recording apparatus according to a fourth embodiment of this invention.

In FIG. 7, reference numeral 41 denotes a recording paper cartridge which contains a photosensitive and pressure-sensitive recording paper 42 in a rolled fashion. The recording paper 42 is led by guide rollers 43a and 43b. An exposure unit 56 is arranged at the central portion of this system. This exposure unit 56 includes an original support 44 which is transparent, an original 45 placed on the support 44, and a light source 58 which is slidably movable along the support 44 by a driving means (not shown). The recording paper 42 is subjected to exposure by a light from the light source 58 through the transparent original 45 and the original support 44.

The exposure unit 56 further includes a press plate 46 for pressing the recording paper 42 against the original 45. The press plate 46 is provided with a panel heating member 48 for heating the recording paper 42 during the exposure. A thermal insulator 47 is interposed between the press plate 46 and the heating member 48 for preventing the heat from conducting to the press plate 46 from the heating member 48. The press plate 46 is mechanically coupled to a first motor 50 through a crank lever 49. Rotational motion of the first motor 50 is converted into a vertically reciprocating motion on account of the crank lever 49.

Following the guide roller 43b, the recording paper 42 is led to a pair of pressure rollers 51a and 51b. A counterpart roller 51a is driven by a second motor 52 through a driving belt 52a. A developer sheet 53 is fed into a nip between the pressure rollers 51a and 51b by the aid of a guide member 53a. The recording paper 42 and the developer sheet 53 are simultaneously subjected to pressure development by the rollers 51a and 51b. The recording paper 42 is wound around a winding roller 54 through a feeding roller 57. On the other hand, the developer sheet 53 is fed to a pair of thermal fixing rollers 55a and 55b through a guide member 55c. The fixed sheet 53 is then fed out of the device.

The guide rollers 43a and 43b are arranged to allow the recording paper 42 to move smoothly between the original 44 and the panel heating member 48 when the press plate 46 is lifted at the highest position corresponding to the top dead center of the crank arm 49.

An operation of the fourth embodiment will be described.

The photosensitive and pressure-sensitive recording paper 42 rolled in the cassette 41 is extended via the guide roller 43a, the original support 44, the guide roller 43b, the pressure rollers 51a and 51b, and the feeding roller 57, and is wound around the roller 54. The paper feeding continues until a predetermined length of the recording paper 42 is fed. The original 45 may be placed on the original support 44 before starting the paper feed, or the original 45 may be placed on the support 44 after the paper feeding is ended.

The first motor 50 is actuated when the paper feeding is ended, thereby downwardly moving the crank lever 49. The press plate 46 is accordingly moved downwardly to press the recording paper 42. Thus, the recording paper 42 is brought into contact with the original 45. The first motor 50 stops when the crank lever 49 reaches the bottom dead center. The recording paper 42 and the original 45 are kept in the contact state during the exposure. The panel heating member 48 is also in contact with the recording paper 42 to heat the paper 42. In this embodiment, the recording paper 42 should be maintained at a temperature about 60 C during the exposure period in order to realize an excellent image with superior gradation.

The light source 58 arranged below the recording paper support 44 is turned on and slidingly moved from left to right in the drawing. The recording paper 42 is exposed on line basis by the light entering from the back surface of the paper support 44.

After the exposure, the first motor 50 is actuated until the crank lever 49 reaches the top dead center. The recording paper 42 is free from the restriction of the press plate 48, and then the winding roller 54 and the second motor 52 start driving. The recording paper 42 is fed into a nipo between the pressure rollers 51a and 51b through the guide roller 43b. The developer sheet 53 is also fed into the nip between the pressure rollers 51a and 51b by means of a feeding mechanism (not shown). The recording paper 42 is overlaid the developer sheet 53, and they are subjected to pressure development by the pressure rollers 51a and 51b. Then, the recording paper 42 is wound around the winding roller 54 through the feeding roller 57, and on the other hand the developer sheet 53 is fed to the thermal fixing rollers 55a and 55b through the guide member 55c. The image on the developer sheet 53 is fixed and the image fixed sheet is discharged outside the device.

The panel heating member 48 starts heating when a main switch for this device is switched on. This heating member quickly reaches the predetermined temperature substantially with no loss of heating energy, since it is overlaid the thermal insulator 47. Further, the heating member 48 requires a low electric energy for maintaining the heating temperature at the predetermined value.

The thermal insulator 47 may be made of any materials, such as silicon rubber, insulating sponge, or the like insofar as it is thermally insulative and sufficiently resilient so that the recording paper 42 is fittable on the uneven surface of the image original 45. This resilient insulator 47 ensures the recording paper 42 to be uniformly heated.

A fifth embodiment of the present invention will be described with reference to FIGS. 8 and 9. This embodiment relates to an exposure device which is adapted for an original contacting type exposure system employing the photosensitive and pressure-sensitive recording sheet as proposed in U.S. Pat. No. 4,399,209.

Figure 8:
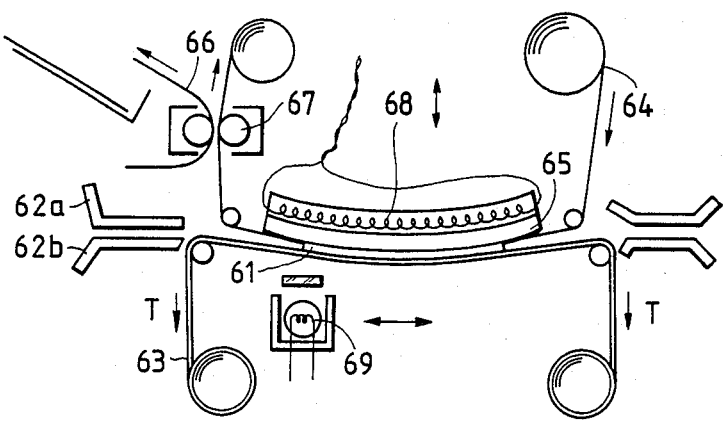
FIGS. 8 and 9 are schematic views showing an overall arrangement of an exposure device for an image recording apparatus according to a fifth embodiment of this invention.

In FIG. 8, an original 61 inserted from an original inlet 62a, 62b is conveyed by a conveyor belt 63 which is made of a transparent and flexible material. The conveyor belt 63 undergoes tension T by a motor (not shown). Although the original 61 is not directly applied with the tension, the original 61 is followed by the conveyor belt 63 and thus considered that the original 61 is essentially stretched.

A continuous, elongated web-like photosensitive and pressure-sensitive recording paper 64 is extended along the conveyor belt 63. The photosensitive and pressure rupturable layer formed on the recording paper 64 faces the original 61. A contact plate 65 is arranged above the recording paper 64. The contact plate 65 has a convex surface which faces the recording paper 64. The convex surface of the plate 65 is coated with a mat black paint. The contact plate 65 is further provided with a pannel-like heating member 68 for heating the surface of the plate 65. This heating member 68 is controlled by a suitable control system as shown in the first, second, or third embodiment. The contact plate 65 is vertically moved by a driving system (not shown).

A light source 69 is arranged under the conveyor belt 61, and slidingly movable along the conveyor belt 61 by a driving system (not shown).

Reference numeral 67 denotes a developer pressure roll. A developer sheet 66 is fed into a nip between the developer pressure rolls 67 and overlaid the recording paper 64 to develop the latent image formed on the recording paper 64.

An operation of this embodiment will be described. The original 61 is conveyed by the conveyor belt 63 and set at the exposing position. The contact plate 65 is moved downwardly so that the recording paper 64 is brought into contact with the original 61 as shown in FIG. 9. In this condition, the recordding paper 64 is heated by the heating member 68 through the contact plate 65. The conveyor belt 63 is flexibly fitted to the convex surface of the contact plate 65. Thus, the original 61 is subjected to the urging force from the upward direction by the tension T. Since this urging force is weak, the pressure rupturable microcapsules on the recording paper 64 are not ruptured. Further, the original 61 is kept in close contact with the recording paper 64 without forming any gaps and air bubbles therebetween due to the combination of the convex surface of the contact plate 65 and the flexible conveyor belt 63 applied with the tension T.

Under this condition, the light source 69 is turned on and scanned along the original 61. The light from the light source 69 is irradiated onto the recording paper 64 through the original 61. The image is clearly formed on the recording paper 64 because the original 61 and the recording paper 64 are in intimate contact with each other. The exposure light is partially transmitted to the contact plate 65 and absorbed by the mat black coated surface of the contact plate 65. The recording paper 64 is heated up to the predetermined temperature so as to show the optimum sensitivity. The exposed recording paper 64 is developed in the same manner as is described in the foregoing embodiments.

Figure 9:
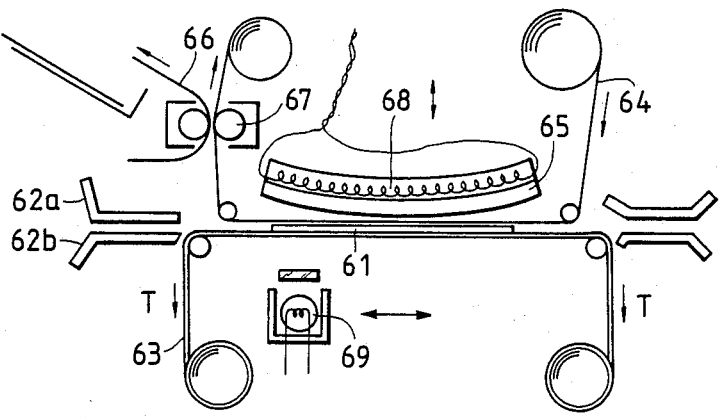
Figure 10:
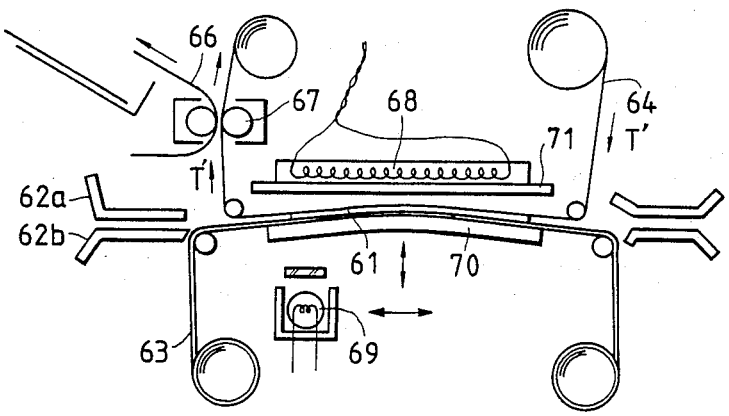
FIG. 10 is a schematic view showing an overall arrangement of an exposure device for an image recording apparatus according to a sixth embodiment of this invention.

A sixth embodiment of this invention will be described with reference to FIG. 10 in which the same parts or corresponding elements shown in FIGS. 8 and 9 are designated by the same numerals, and the description thereof is omited herein.

A contact plate 70 made of a transparent material is arranged under a conveyor belt 63. A recording paper 64 is applied with tension T' generated by a motor (not shown). A black painted plate 71 is set above the contact plate 70 and the recording paper 64. This plate 71 is also provided with a panel shape heating member 68. The heat generated by the heating member 68 is transmitted to the recording paper 64 by radiation or circulation.

An operation of this embodiment will be performed in essentially the same fashion as the fifth embodiment, so that the similar effect can be obtained as is in the case of the fifth embodiment.

As given explanation above, according to the present invention, the temperature of the photosensitive recording medium is maintained at the optimum condition during the exposure. Further, the present invention can overcome the fluctuation of the light intensity and control the gradation of the image formed on the recording paper. In the original-contact type exposure system, the insulator provided on the back surface of the panel heating member enhances the thermal efficiency. The flexible support and the convex surface of the contact plate ensures the recording medium to be free from fogging caused by uneven surface of the contact plate.

With these effects, the image is formed with excellent clearness, sharpness, reproducibility, various gradation, and so on.

Although this invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed. For example, following modifications and variations may be realized.

The first, second and third embodiments may employ a reflecting exposure system using the light transmitted through the transparent original. This reflecting exposure system uses the light reflected from the original as an exposure light.

The heating system for heating the recording medium in the first, second and third embodiments may be arranged out of the exposing area. The recording medium may be heated in advance to a desired temperature and then set to the exposing area.

The recording paper may be replaced by photosensitive recording medium, such as a photosensitive heat curable recording paper, a silver halide photographic paper, or the like.

The temperature control may be automatically performed in addition to a manual control operation. The temperature setting operation may be automatically selected on the basis of the temperature setting data corresponding to the sensitivity of each photosensitive recording medium.

A self-contained type imaging sheet may be employed for the photosensitive and pressure-sensitsive recording paper and the developer sheet. The self-contained type imaging sheet includes photosensitive pressure rupturable microcapsules for each color and its developing material.

The photo-curing resin used in the photosensitive and pressure-sensitive recording paper may be replaced by a photo-softening resin. This photo-softening resin is softened by light radiation. When this photo-softening type photosensitive recording medium is employed, the trichromatic resolution filter should also be adjusted to the properties of this photo-softening resin.

The photosensitive recording medium is not limited to a rolled paper. A cut-sheet type recording medium may be used. Further, the material of the recording medium may be selected from various materials such as synthetic paper, plastic films, and the like.

The recording medium may be coated with a microcapsule layer including a mono-color dye precursor for a mono-color recording system.

The temperature control system may includes both the heating means and the cooling means.

What is claimed is:

1. An exposure device for exposing a light on a photosensitive recording medium to form a latent image corresponding to an original, comprising: a supporting means for supporting the photosensitive recording medium; a light source means for emitting a light, said light being applied to an original and a light carrying an image of the original being irradiated onto the photosensitive recording medium; and a temperature control means for controlling a temperature of the photosensitive recording medium to a predetermined temperature to attain an optimum photosensitivity of the photosensitive recording medium.

2. The exposure device as claimed in claim 1, wherein the photosensitive recording medium has a photosensitive material and a dye precursor selected from colors comprising cyan, magenta and yellow, wherein said photosensitive material is changed from a first phase to a second phase when the light is exposed, and said photosensitive material and said dye precursor are encapsulated in a pressure rupturable microcapsule and a mechanical strength of said microcapsule is different between the first phase and the second phase of said photosensitive material.

3. The exposure device as claimed in claim 2, wherein said temperature control means comprises a temperature sensor means for sensing a temperature of the photosensitive recording medium and outputting a sensed temperature; a comparator means connected to said temperature sensor to receive the sensed temeretature, wherein said sensed temperature is compared with the predetermined temperature and said comparator means outputs a comparison result; and a temperature adjusting means for controlling the temperature of the recording medium to the predetermined temperature in response to the comparison result.

4. The exposure device as claimed in claim 3, wherein said temperature adjusting means comprises a heating member.

5. The exposure device as claimed in claim 3, wherein said temperature adjusting means comprises a cooling member.

6. The exposure device as claimed in claim 2, wherein said temperature control means comprises a first sensor means for sensing the temperature of said photosensitive recording medium and outputting a first signal indicative of a sensed temperature; a second sensor means for sensing an intensity of the light irradiated from said light source means and outputting a second signal indicative of a sensed light intensity; a processing means connected to both said first sensor means and said second sensor means for processing said first signal and said second signal to provide a third signal indicative of a temperature which causes the photosensitive recording medium to have an optimum photosensitivity; and a temperature adjusting means for adjusting the temperature of the photosensitive recording medium in response to said third signal.

7. The exposure device as claimed in claim 6, wherein said first sensor means comprises a thermister for sensing the temperature of the photosensitive recording medium and outputting a first analog signal indicative of the sensed temeprature and a first analog-to-digital converter connected to said thermister for converting the first analog signal to a first digital signal, said second sensor means comprises a photosensor for sensing the light intensity of the light irradiated from said light source means and outputting a second analog signal indicative of the sensed light intensity and a second analog-to-digital converter connected to said photosensor for converting the second analog signal to a second digital signal, and said processing means comprises a central processing unit.

8. The exposure device as claimed in claim 1, wherein said supporting means is transparent to allow the light to pass therethrough, the original being laid on said supporting means and the photosensitive recording medium being overlaied the original so that the light is irradiated onto the photosensitive recording medium through the original.

9. The exposure device as claimed in claim 8, further comprising a pressing means for pressing the photosensitive recording medium against the original, said pressing means having a heat generating member and a heat insulating member for heat insulating a heat generated by said heat generating member.

10. The exposure device as claimed in claim 9, wherein said heat generating member is a panel shape heater element, said element heating an entire surface of the photosensitive recording medium substantially uniformly.

11. The exposure device as claimed in claim 9, wherein said heat insulating member is made of a resilient material and said heat insulating member is brought into contact with the photosensitive recording medium when said pressing means is actuated.

12. The exposure device as claimed in claim 1, wherein said supporting means is an elongated belt-shaped flexible member, said member being transparent to allow the light to pass therethrough and transfering the original and the photosensitive recording medium placed thereon, and said member being applied with a predetermined tension.

13. The exposure device as claimed in claim 12, further comprising a pressing means for pressing the photosensitive recording medium against the original, said pressing means having a heat generating member and a heat insulating member for heat insulating a heat generated by said heat generating member.

14. The exposure device as claimed in claim 13, wherein said heat generating member is a panel shape heater element, said element heating an entire surface of the photosensitive recording medium substantially uniformly.

15. The exposure device as claimed in claim 14, wherein said pressing means has a convex surface which faces the supporting means.

16. The exposure device as claimed in claim 14, further comprising a supporting member for supporting the flexible member, said supporting member having a convex surface on which the flexible member is placed, wherein said pressing means is actuated to press the flexible member against the convex surface of said supporting member.

* * * * *